United States Patent [19]

Irving et al.

[11] Patent Number: 4,546,067
[45] Date of Patent: Oct. 8, 1985

[54] IMAGE PRODUCTION UTILIZING MULTIFUNCTIONAL LIGHT SENSITIVE COMPOUNDS

[75] Inventors: Edward Irving, Burwell; Terence J. Smith, Royston, both of England

[73] Assignee: Ciba Geigy Corporation, Ardsley, N.Y.

[21] Appl. No.: 571,211

[22] Filed: Jan. 16, 1984

[30] Foreign Application Priority Data

Jan. 26, 1983 [GB] United Kingdom ............... 8302160
Sep. 1, 1983 [GB] United Kingdom ............... 8323448

[51] Int. Cl.⁴ ................................. G03C 5/16
[52] U.S. Cl. .................................. 430/325; 430/330; 430/327; 430/280; 430/311
[58] Field of Search ............... 430/330, 327, 280, 325, 430/285, 287, 311

[56] References Cited

U.S. PATENT DOCUMENTS

| | | | |
|---|---|---|---|
| 3,409,593 | 11/1968 | Messarb et al. | 430/280 |
| 3,424,699 | 1/1969 | Stark et al. | 525/337 X |
| 3,497,353 | 2/1970 | Steppan et al. | 430/325 X |
| 3,497,354 | 2/1970 | Steppan et al. | 430/325 X |
| 3,539,343 | 11/1970 | Munder et al. | 430/325 X |
| 3,726,679 | 4/1973 | Abolafia et al. | 430/330 |
| 3,784,647 | 1/1974 | Fleming et al. | 525/523 |
| 4,074,008 | 2/1978 | Green | 430/330 |
| 4,291,118 | 9/1981 | Boduch et al. | 430/325 X |

Primary Examiner—John E. Kittle
Assistant Examiner—Cynthia Hamilton
Attorney, Agent, or Firm—Harry Falber

[57] ABSTRACT

A layer of a liquid composition containing
(A) a heat-activated latent polymerizing agent for 1,2-epoxides with
(B) a light-sensitive compound having in the same molecule at least one 1,2-epoxide group and at least one chalcone or cinnamate group, or with a mixture of
(C) a compound containing at least one 1,2-epoxide group together with
(D) a compound containing at least one chalcone or cinnamate group, is heated so that the layer solidifies due to thermal polymerization through the 1,2-epoxide group, remaining, however, photocrosslinkable. The solidified layer is exposed in a predetermined pattern to actinic radiation, the parts so exposed becoming photocrosslinked through the chalcone or cinnamate unit(s) and hence insoluble. An image is produced which can be developed by means of suitable solvents.

An example of a suitable latent polymerizing agent (A) is boron trichloride-N-methylpiperidine complex, and a suitable light-sensitive compound (B) is 1-(p-(glycidyloxy)phenyl)-5-phenylpenta-1,4-dien-3-one.

19 Claims, No Drawings

IMAGE PRODUCTION UTILIZING MULTIFUNCTIONAL LIGHT SENSITIVE COMPOUNDS

This invention relates to a process for the production of images by heating followed by exposure to actinic radiation.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through a negative whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerised substance were applied to a support and this layer were converted into a substantially solid, non-tacky state, ready for irradiation, without the use of organic solvents. Not only would, in this stage, the use be avoided of solvents which might present problems of toxicity and flammability and also cause expense in their recovery, but the production on a continuous basis of coated supports, ready for irradiation, would be facilitated.

We have found that this object can be achieved by the use of certain liquid compositions which contain two kinds of groups through which respectively thermal polymerisation and photocrosslinking can occur. These two types of groups may form part of the same molecule, or they may form part of different molecules. The groups are chosen so that thermal polymerisation of a layer of a liquid composition occurs rapidly to form a solid, essentially tack-free layer, which is, however, still soluble in certain solvents. When desired, a part or parts of the layer are subjected to actinic radiation and photocrosslinking takes place through the other type of group in the already thermally polymerised molecules of the layer, the parts of the layer which undergo photocrosslinking becoming much more resistant to solution in the solvent.

U.S. Pat. No. 4,291,118 relates to a method for forming relief images from a film of a liquid photopolymerisable material, comprising exposing the film to chemical hardening treatment sufficient to solidify it, then treating the solidified film in a pattern in a manner differentiating the chemical condition of the film in the pattern as distinct from the chemical condition of the solidified mass not in the pattern, and then selectively removing the portion of the mass in one of the chemical conditions leaving that portion of the mass in the other chemical condition to form a relief image. To bring about the differentiation in chemical condition actinic radiation is used in all the embodiments described, although the disclosure contains the remark "Heat could also by extension be used".

In the process described in the U.S. Patent, therefore, the film of liquid material is exposed to actinic radiation and then the solidified film is re-exposed to actinic radiation in the form of a pattern so that a part or parts of it become less easily removed by a solvent, and finally the image is developed by washing away with the solvent the more readily removed part or parts, i.e., those which were not re-exposed.

The conditions of exposure have to be carefully controlled; if the first exposure is insufficient, the solidified material remains tacky and inconvenient to handle whereas if it is excessive, images of poor definition are obtained.

Only the use of photopolymerisable polyene-polythiol compositions is described. These have the disadvantage that the polymerisation which is initiated on exposure to actinic radiation continues when such exposure is interrupted. It follows that if images of good quality are to be obtained the second irradiation stage must be performed without delay. This is a constraint on industrial utilisation of the process.

It has now been found that the disadvantages of the prior art processes can be overcome by use of compositions containing both 1,2-epoxide groups and chalcone and/or cinnamate groups on the same or different molecules.

Compounds containing one or more epoxide groups, and those containing one or more chalcone of cinnamate groups, are well known and are commercially available. Compounds containing, in the same molecule, both at least one 1,2-epoxide and at least one chalcone or cinnamate group, are also known from U.S. Pat. Nos. 3,409,593, 3,497,353, and 3,539,343. As described in those Specifications it is also known to form homopolymers or copolymers from these compounds through ring-opening of the epoxide groups by means of ionic catalysts, and to apply these homopolymers or copolymers to a substrate to form a light-sensitive reproduction layer. The ionic catalysts are usually anionic, viz., an aluminium, zinc, or magnesium alkyl, such as aluminium triethyl, and polymerisation is carried out at from 20° to 100° C., normally at 60° to 70° C. In one case, however (U.S. Pat. No. 3,539,343) use of a cationic catalyst such as boron trifluoride or an ether complex thereof is described, with the observation that polymerisation temperatures should be as low as possible, typically from −5° to +60° C.: in the sole Example, a temperature of 15° to 22° C. is used.

These homopolymers and copolymers are usually solids and have to be applied as solutions in chloroform or benzene, which, as already pointed out, is disadvantageous.

We have surprisingly found that liquid compositions containing at least one epoxy group and at least one chalcone or cinnamate group can be thermally polymerised using latent catalysts on a carrier such as a copper-clad laminate, without the need to use a solvent, to form a solid but still crosslinkable layer which can then be exposed imagewise to actinic radiation to crosslink the exposed areas, leaving the unexposed areas soluble in a solvent developer.

One aspect of this invention accordingly provides a process for the production of an image which comprises (i) heating a layer, supported on a carrier, of a liquid composition containing (A) a heat-activated latent polymerising agent for 1,2-epoxides with (B) a light-sensitive compound having in the same molecule at least one 1,2-epoxide group of formula

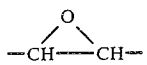

and at least one chalcone or cinnamate group of formula

   II where Ar is an optionally substituted benzene ring and X is a chain of formula

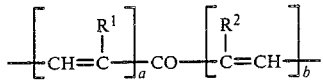   III or

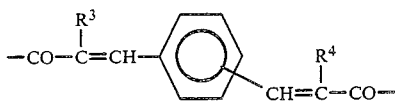   IV or

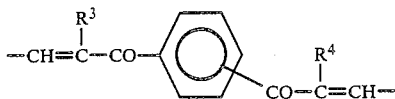   V or

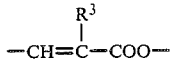   VI $R^1$ and $R^2$ individually denote a hydrogen atom, an alkyl group of 1 to 4 carbon atoms, or conjointly denote a polymethylene chain of 2 to 4 methylene groups, $R^3$ and $R^4$ each denote a hydrogen atom, an alkyl group of 1 to 4 carbon atoms, or a phenyl group, and a and b each denote zero, 1, or 2 with the proviso that they do not both denote zero, or with a mixture of (C) a compound containing at least one 1,2-epoxide group of formula I, together with (D) a compound containing at least one chalcone or cinnamate group of formula II, or with a mixture of a light sensitive compound (B) with a compound (C) and/or (D) as herein defined, such that the layer solidifies by thermal polymerisation and becomes essentially non-tacky but remains photocrosslinkable, and subsequently, (ii) exposing the solidified layer to actinic radiation in a predetermined pattern such that exposed parts of the layer are crosslinked and (iii) removing those parts of the layer which have not become substantially crosslinked by treatment with a solvent therefor.

The phrase "exposing in a predetermined pattern" includes both exposure through an image-bearing transparency and exposure to a laser beam moved as directed by a computer to form an image.

Usually the compound (C) contains one or two groups of formula I, and the compound (D) contains 2 to 20 groups of formula II. Generally (B), (C), and (D) have a molecular weight of at most 20,000. Preferably the group or groups of formula I are either directly attached to a cycloaliphatic ring through both indicated free valencies, or form part of a 2,3-epoxypropyl group directly attached to an atom of oxygen, nitrogen, or sulphur.

Preferred compounds (B) are those which contain 1 or 2 groups of formula I and 1 to 20 groups of formula II. These groups may be attached to aliphatic, aromatic, araliphatic, cycloaliphatic or heterocyclic molecules. Particularly preferred compounds (B) are those in which the group —Ar—X— is a cinnamoyloxy group or forms part of a group of formula

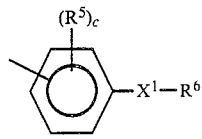   VII or

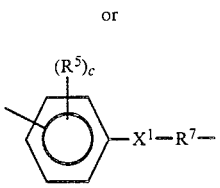   VIII where $X^1$ denotes a group of formula III, IV or V, each $R^5$ represents a halogen atom, such as a chlorine or bromine atom, an alkyl, cycloalkyl, alkenyl, alkoxy or alkoxycarbonyl group containing up to 9 carbon atoms, such as a methyl, methoxy, cyclohexyl, allyl, or ethoxycarbonyl group, a hydroxy group, a primary, secondary or tertiary amino group, a nitro group, a carboxyl, sulphonic or phosphoric acid group or a salt thereof, especially a sodium, potassium, or tetramethylammonium salt, each c represents zero or an integer of 1 to 4, preferably zero, 1 or 2, $R^6$ denotes an alkyl group of 1 to 6 carbon atoms, an alkenyl group of 2 to 6 carbon atoms, a cycloalkyl group of 3 to 6 carbon atoms, an aryl group of 6 to 15 carbon atoms or an alkaryl or aralkyl group of 7 to 10 carbon atoms, said group being optionally substituted by one or more hydroxyl groups, such as a methyl, 2-hydroxyethyl, phenyl, 4-hydroxybutyl, allyl, cyclohexyl, tolyl or benzyl group and $R^7$ denotes an alkylene group of 1 to 6 carbon atoms, an alkenylene group of 2 to 6 carbon atoms, a cycloalkylene group of 3 to 6 carbon atoms, an arylene group of 6 to 15 carbon atoms or an alkarylene or aralkylene group of 7 to 10 carbon atoms, such as a methylene, 2-butenylene, cyclohexenylene, phenylene, and 1-phenylethylene groups.

Especially preferred groups of formula VII are those in which $R^6$ denotes a group of formula

IX or a methyl or ethyl group. Especially preferred groups of formula VIII are those in which $R^7$ denotes a group of formula

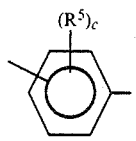 X where $R^5$ and c are as hereinbefore defined.

The compound (B) may, for example, be a glycidyl ester of a cinnamic acid, a partial ester formed by reaction of an epoxide resin with less than one equivalent of a cinnamic acid, or a glycidyl ether of a monohydric or dihydric phenol containing a chalcone unit, especially one of formula

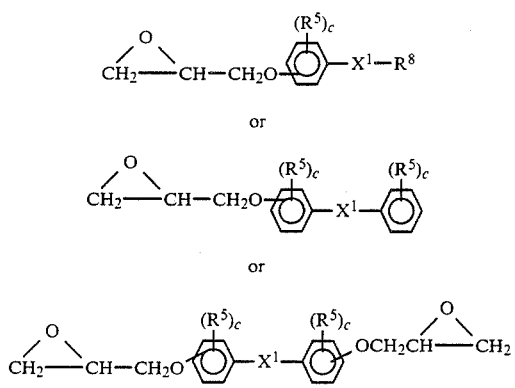

where $R^8$ denotes a methyl or ethyl group and $R^5$, $X^1$ and c are as hereinbefore defined, glycidyl ethers prepared by advancing diglycidyl ethers containing chalcone units with bisphenols such as 2,2-bis(4-hydroxyphenyl)propane (bisphenol A), bis(4-hydroxyphenyl)methane or 2,2-bis(3,5-dibromo-4-hydroxyphenyl)propane (tetrabromobisphenol A), or with hydantoins such as 5,5-dimethylhydantoin or 5,5-pentamethylenehydantoin, and glycidyl derivatives prepared by advancing diglycidyl derivatives of such bisphenols or hydantoins with hydroxy-substituted chalcones.

Particularly preferred compounds (B) are glycidyl cinnamate, partial reaction products of cinnamic acid with epoxidised novolaks or diglycidyl ethers of bisphenol A, and compounds of formula prepared by advancement of a bisphenol A diglycidyl ether with 2,4-, 2',4-, 2',4'-, 2',3-, 2,5'-, 2,2'-, 4,4'-, or 3,4'-dihydroxychalcone, or 1,5-bis(p-hydroxyphenyl)-penta-1,4-dien-3-one, glycidyl derivatives prepared by advancing N,N'-diglycidyl-5,5-dimethyl hydantoin with 1,5-bis(p-hydroxyphenyl)penta-1,4-dien-3-one, 4,4'-diglycidyloxychalcone, 1,4-bis(3-(4-glycidyloxyphenyl)-3-oxo-1-propenyl)benzene, 4,4'-diglycidyl-2,6-dimethylchalcone, 1-(p-glycidyloxyphenyl)hexa-1,4-dien-3-one, 1-(p-glycidyloxyphenyl)-5-phenylpenta-1,4-dien-3-one, 1-(p-glycidyloxyphenyl)-5-(p-hydroxyphenyl)penta-1,4-dien-3-one, or 1,5-bis(p-glycidyloxyphenyl)penta-1,4-dien-3-one.

Typical compounds (C) are mono or polyglycidyl esters obtainable by reaction of a compound containing one or more carboxylic acid groups per molecule with epichlorohydrin or glycerol dichlorohydrin in the presence of an alkali. Such glycidyl esters are preferably derived from aliphatic mono and polycarboxylic acids, e.g., acetic and propionic acid, succinic acid, glutaric acid, adipic acid, pimelic acid, suberic acid, azelaic acid, sebacic acid, or dimerised or trimerised linoleic acid; from cycloaliphatic mono and polycarboxylic acids such as tetrahydrophthalic acid, cyclohexane carboxylic acid, 4-methyltetrahydrophthalic acid, hexahydrophthalic acid, and 4-methylhexahydrophthalic acid; and from aromatic mono and polycarboxylic acids such as benzoic acid, phthalic acid, isophthalic acid, and terephthalic acid.

Further examples are mono and polyglycidyl ethers obtainable by reaction of a compound containing one or more free alcoholic hydroxyl and/or phenolic hydroxyl groups per molecule with epichlorohydrin under alkaline conditions or, alternatively, in the presence of an acidic catalyst and subsequent treatment with alkali. These ethers may be made from acyclic alcohols such as butanol and other monohydric alcohols having from 1 to 8 carbon atoms, ethylene glycol, poly(oxyethylene)-glycols, propane-1,2-diol, poly(oxypropylene)glycols, propane-1,3-diol, butane-1,4-diol, poly(oxytetramethylene)glycols, glycerol, pentaerythritol, and poly(epichlorohydrin). Or they may be made from mononuclear phenols, such as phenol itself, cresol, resorcinol and from polynuclear phenols, such as bis(4-hydroxyphenyl)methane, 4,4'-dihydroxydiphenyl, bis(4-hydroxyphenyl)sulphone, 1,1,2,2-tetrakis(4-hydroxyphenyl)ethane, 2,2-bis(4-hydroxyphenyl)propane (otherwise known as bisphenol A), 2,2-bis(3,5-dibromo-4-hydroxy-

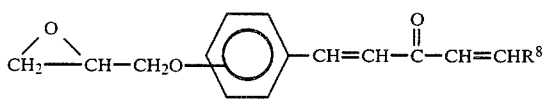 XIV

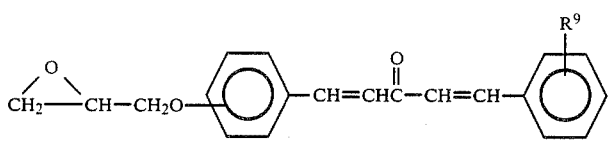 XV and

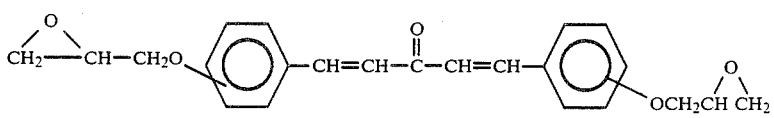 XVI where $R^8$ is as hereinbefore defined and $R^9$ represents a hydrogen atom or a hydroxy group, glycidyl ethers phenyl)propane, and novolaks formed from aldehydes such as formaldehyde with phenol.

Other suitable compounds (C) are poly-(N-glycidyl) compounds including, for example, those obtained by dehydrochlorination of the reaction products of epichlorohydrin with amines containing at least two amino-hydrogen atoms, such as aniline, n-butylamine, and bis(4-aminophenyl)methane; triglycidyl isocyanurate; and N,N'-diglycidyl derivatives of cyclic alkylene ureas, such as ethyleneurea, and of hydantoins such as 5,5-dimethylhydantoin.

Epoxide resins in which some or all of the epoxide groups are not terminal may also be employed, such as vinylcyclohexene dioxide, limonene dioxide, dicyclopentadiene dioxide, 4-oxatetracyclo[6.2.1.0$^{2,7}$.0$^{3,5}$]undec-9-yl glycidyl ether, the bis(4-oxatetracyclo[6.2.1.0$^{2,7}$.0$^{3,5}$]undec-9-yl)ether of ethylene glycol, 3,4-epoxycyclohexylmethyl 3',4'-epoxycyclohexanecarboxylate and its 6,6'-dimethyl derivative, the bis(3,4-epoxycyclohexanecarboxylate) of ethylene glycol, 3-(3,4-epoxycyclohexyl)-8,9-epoxy-2,4-dioxaspiro[5,5]undecane, and epoxidised butadienes or copolymers of butadiene with ethylenic compounds such as styrene and vinyl acetate. If desired a mixture of compounds (C) may be used.

Especially preferred compounds (C), used in the process of this invention are 2,2,4-trimethylpentyl glycidyl ether, phenyl glycidyl ether, butyl glycidyl ether, diglycidyl ethers of dihydric phenols such as 2,2-bis(4-hydroxyphenyl)propane and bis(4-hydroxyphenyl)methane and of dihydric alcohols such as of butane-1,4-diol, and N,N'-derivatives of hydantoins, such as 1,3-diglycidyl-5,5-dimethylhydantoin.

Compounds (D) include full and partial esters of cinnamic acid with aliphatic glycols and polyols such as triethylene glycol, tetraethylene glycol, and pentaerythritol and epoxide resins that haven been fully esterified by a cinnamic acid, especially epoxidised novolaks and diglycidyl ethers of bisphenol A which have been thus esterified.

Also suitable as compound (D) are chalcones of formula

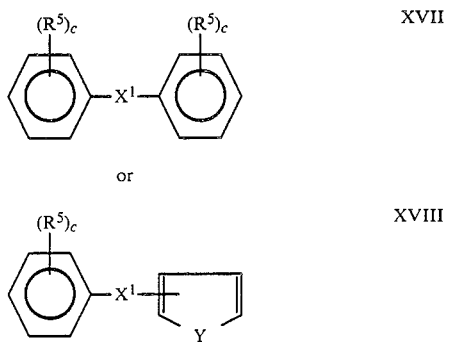

where R$^5$, X$^1$ and c have the meanings previously assigned, and Y denotes an oxygen or sulphur atom, and epoxide resins that have been advanced to negligible epoxide content by reaction with a chalcone of formula XVII or XVIII in which one or two groups R$^5$ denote hydroxy, carboxyl, or primary or secondary amino groups.

Preferred compounds D are 1,5-bis(4-hydroxyphenyl)penta-1,4-dien-3-one, bisphenol A diglycidyl ether advanced to negligible epoxide content with 1,5-bis(4-hydroxyphenyl)penta-1,4-dien-3-one, tetrabromobisphenol A diglycidyl ether advanced to a negligible epoxide content with 1,5-bis(4-hydroxyphenyl)-penta-1,4-dien-3-one, 1,3-bis(4-hydroxyphenyl)prop-1-en-3-one, 1-(2-furyl)-3-(4-hydroxyphenyl)prop-1-en-3-one, and 2,6-bis(4-hydroxybenzylidenyl)cyclohexanone.

The polymerising agent (A) is one having little or no effect on the epoxide group of (B) and (C) if present, below a certain 'threshold temperature' but which causes rapid polymerisation through the epoxide ring once the temperature of the mixture rises above that threshold temperature. The threshold temperature is preferably at least 100° C., so that (A) has a significant heat-polymerising effect on (B) and (C) only at temperatures above 100° C. Preferably the layer is heated at 120° C. to 200° C. for from 2 to 20 minutes.

Suitable polymerising agents (A) include complexes of boron trichloride or of boron trifluoride, chelates of boron difluoride, for example with a diketone, dicyandiamide or an imidazole. Suitable boron difluoride chelates such as difluoroboronacetoacetanilide are described in U.S. Pat. No. 3,424,699. Suitable imidazoles include 2-methylimidazole, 2-phenylimidazole, 1-benzyl-2-methylimidazole and 1-cyanoethyl-2-methylimidazole.

Preferred polymerising agents (A) are complexes of boron trichloride with a tertiary amine, or of boron trifluoride with a triaryl phosphine, with piperidine, or with a primary amine, these primary and tertiary amines being aliphatic, cycloaliphatic or heterocyclic. An example of a suitable boron trichloride-tertiary amine complex is boron trichloride-trimethylamine complex; other suitable boron trichloride-tertiary amine complexes are described in U.S. Pat. No. 3,784,647, an especially preferred such complex being boron trichloride-octyldimethylamine complex. Examples of suitable boron trifluoride complexes are those with triphenylphosphine, isophoronediamine, benzylamine, cyclohexylamine and tetramethylhexamethylenediamine. An especially preferred boron trifluoride complex is that with ethylamine.

The compounds (B), (C) and (D) may be liquids or solids, but as stated above, the compositions are applied in a liquid form to a carrier. The viscosity of the composition preferably lies within the range 0.1 to 15 Pa s. To render solid materials into the liquid form, and to meet this desired range of viscosity without the addition of volatile solvents, it may be necessary to use mixtures of compounds (B) and (D), or (B) and (C) or (B), (C), and (D). It is particularly advantageous to include, as an epoxide-functional material (C), a monoepoxide, either alone or in admixture with other epoxide-functional materials (B) and (C). Particularly preferred monoepoxides include n-butyl glycidyl ether and phenyl glycidyl ether.

The amount of polymerising agent (A) used is generally from 1 to 10 parts by weight per 100 parts in total of compound (B) and/or (C); 2 to 5 parts by weight of (A) per 100 parts by weight of (B) and/or (C) is particularly preferred.

It is possible to add to the mixture of (A) and (B) and/or (A) and (C) and (D) small amounts of sensitisers which reduce the exposure time or permit the use of light sources of lower output.

The liquid composition can be applied to suitable carriers by the customary techniques, such as spray coating, whirler coating, roller coating, cascade coating, and especially curtain coating. Typically, the carrier is coated such that the layer of the composition is 1 to 250 μm thick. The carrier may be of, for example, copper, aluminium or other metal, paper, synthetic resin, or glass.

In the photocrosslinking stage of the process of this invention actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The times required for the exposure will depend upon a variety of factors which include, for example, the individual compound used, the type of light source, and the distance of that source from the irradiated composition. Suitable times may be readily determined by those familiar with photocrosslinking techniques.

Suitable solvents for development of the image are readily found by routine testing and include cyclohexanone, trimethylcyclohexanone, 2-ethoxyethanol, 1,1,1-trichloroethane, chloroform, and mixtures thereof. The action of the solvent may need to be assisted by agitation or by gentle brushing. When the carrier has a layer of a suitable electrically-conducting metal, usually copper or silver, immediately in contact with the composition, after exposure the non-photocrosslinked polymer can be removed to expose the metal. Metal so exposed may then be etched away in the nonimage areas, so forming a printed circuit, by means of etching fluids such as ferric chloride or ammonium persulphate solutions.

The invention will now be illustrated by reference to the following Examples in which all parts and percentages are by weight.

The compounds that are not commercially available used in these Examples, are prepared as follows:

4-(p-Hydroxyphenyl)but-3-en-2-one (16.2 g) is dissolved in ethanol (50 ml) and slowly treated with sodium hydroxide (4.2 g) in water (58 ml). The mixture is cooled to 10° C. and p-(glycidyloxy)benzaldehyde (17.8 g) in ethanol (50 ml) is added slowly, keeping the temperature below 10° C. The mixture is stirred for a further 2 hours at 10° C. and then filtered.

The precipitate is dissolved in water, adjusted to pH 7 with dilute hydrochloric acid, and the product is extracted into chloroform. The extract is dried over magnesium sulphate, filtered, and evaporated under reduced pressure to give 1-(p-(glycidyloxy)phenyl)-5-(p-hydroxyphenyl)penta-1,4-dien-3-one having an epoxide content of 2.82 equiv./kg (theoretical value 3.11 equiv./kg) as a viscous yellow liquid.

When the 4-(p-hydroxyphenyl)but-3-en-2-one is replaced by an equivalent quantity of 4-phenylbut-3-en-2-one the resultant product is 1-(p-(glycidyloxy)phenyl)-5-phenylpenta-1,4-dien-3-one having an epoxide content of 3.19 equiv./kg (theoretical value 3.27 equiv./kg), a yellow solid, m.pt. 62°–64° C.

Resin I

This denotes a light-sensitive epoxide resin based on 1,5-bis(4-glycidyloxyphenyl)penta-1,4-dien-3-one, bisphenol A, and tetrabromobisphenol A, having a molecular weight of 3000–3500, and an epoxide content of 0.8 to 1.0 equivalents/kg.

Resin II

A mixture of an epoxy novolak resin (100 parts) having an epoxide content of 5.61 equiv. per kg. and being a polyglycidyl ether made from a phenol-formaldehyde novolak of average molecular weight 420, 2,6-di-t-butyl-p-cresol (0.2 part) and chromium III tris octanoate (0.1 part) is heated to 120° C. and cinnamic acid (83 parts) is added over a period of 1 hour. Heating is continued for a further 3½ hours at 120° C. and the mixture is then allowed to cool. The product becomes solid at room temperature and has a negligible epoxide content.

Resin III 2,2-Bis(4-glycidyloxyphenyl)propane having an epoxide content of 5.2 equivs./kg (52.8 g), 1,4-bis(3-(4-hydroxyphenyl)-3-oxo-1-propenyl)benzene (44.4 g), 2-ethoxyethyl acetate (97.2 g) and tetraethylammonium bromide (0.4 g) are heated to 140° C. for 3¼ hours. The solvent is evaporated to give a resin having an epoxide content of 0.48 equivs./kg.

Resin IV

Resin III (48.8 g) is dissolved in 2-ethoxyethyl acetate (50 g) and acetic acid (1.4 g) added. The mixture is heated at 100° C. for 7¼ hours, then evaporated, leaving a resin having a negligible epoxide content.

EXAMPLE 1

A mixture of 1-(p-(glycidyloxy)phenyl)-5-phenylpenta-1,4-dien-3-one (75 parts), n-butyl glycidyl ether (25 parts), and boron trichloride/N-methylpiperidine complex (3 parts) is applied as a coating 10 μm thick onto a copper-clad laminate. It is heated for 5 minutes at 150° C., allowed to cool, and then the solidified layer is irradiated through a negative with a 5000 w metal halide lamp at a distance of 75 cm for 10 minutes. On development with cyclohexanone a good image is obtained.

EXAMPLE 2

The same mixture is prepared as in Example 1. Its viscosity at 25° C. is 0.345 Pa s. The composition is stored at 25° C. for 2 months in the dark, at which time its viscosity at 20° C. is 0.360 Pa s. A portion of this stored composition is applied to a copper-clad laminate as in Example 1 and heated, irradiated and developed under the same conditions. A good image is likewise obtained.

EXAMPLE 3

The process of Example 1 is repeated, using 50 parts of the phenylpentadienone and 50 parts of n-butyl glycidyl ether. The layer is heated for 15 minutes at 160° C., then irradiated for 1 minute. Development under the same conditions gives a good image.

EXAMPLE 4

The process of Example 1 is repeated, using 10 parts of the phenylpentadienone and 25 parts of n-butyl glycidyl ether, but 1 part of boron trichloride/N,N-dimethylcyclohexylamine complex. The coated laminate is heated for 10 minutes at 150° C. and the solidified layer is irradiated through a negative for 10 minutes. On development with cyclohexanone a good image is obtained.

EXAMPLE 5

A mixture of 1-(p-(glycidyloxy)phenyl)-5-(p-hydroxyphenyl)penta-1,4-dien-3-one (100 parts) and boron trichloride/octyldimethylamine complex (4 parts) is applied as a coating 15 μm thick onto a copper-clad laminate. It is heated for 20 minutes at 150° C., allowed to cool, and the solidified layer is irradiated for 20 minutes through a negative as described in Example 1. A good image is developed using cyclohexanone with gentle brushing.

EXAMPLE 6

Resin I (100 g) is dissolved in 1,4-butanediol diglycidyl ether (50 g) and borontrifluoride monoethylamine complex (4.5 g) is added. The resultant mixture is coated at 40° C. onto a copperclad laminate to a thickness of 20 μm. The laminate is heated at 120° C. for 5 minutes, which solidifies the coating. It is then irradiated through a negative for 30 seconds, as described in Example 1. Development in cyclohexanone gives a good image.

EXAMPLE 7

Resin II (10 g) is dissolved in butyl glycidyl ether (5 g) and the boron trifluoride complex of triphenyl phosphine (0.2 g) and 4,4'-bis(dimethylamino)benzophenone (0.2 g) is added. The resultant solution is coated to a thickness of 35 μm onto a copper-clad laminate. The laminate is heated at 120° C. for 5 minutes which solidifies the coating. It is then irradiated through a negative for 15 minutes, as described in Example 1. Development in chloroform gives a good image.

EXAMPLE 8

Resin III (20 parts) is dissolved in butyl glycidyl ether (10 parts) and boron trichloride trimethylamine complex (0.6 part) is added. This solution is coated onto a copper-clad laminate to give a coating 20 μm thick. The laminate is heated at 120° C. for 10 minutes to give a tack-free surface. This is irradiated through a negative, as described in Example 1, for 5 minutes. Development in cyclohexanone gives a good image.

EXAMPLE 9

Resin IV (20 parts) is dissolved in butyl glycidyl ether (10 parts), and 1,4-butane diol diglycidyl ether (10 parts). Boron trichloride octyldimethylamine complex (2 parts) is then added and the resultant solution is coated onto a copper-clad laminate to give a coating 40 μm thick. This is heated at 120° C. for 15 minutes, to give a tack-free coating. The coating is irradiated for 5 minutes through a negative, as described in Example 1. Development in cyclohexanone gives a good image.

EXAMPLE 10

Resin I (10 parts) is dissolved in phenyl glycidyl ether (10 parts) to which is added difluoroboronacetoacetanilide (0.1 part). The solution is coated onto a copper-clad laminate as a layer 35 μm thick, then heated at 120° C. for 10 minutes to solidify the coating. The coating is then irradiated for 1 minute through a negative as described in Example 1. Development in cyclohexanone gives a good image.

What is claimed is:

1. A process for the production of an image which comprises (i) heating a layer, supported on a carrier, of a liquid composition containing (A) a heat-activated latent polymerizing agent for 1,2-epoxides with (B) a light-sensitive compound having in the same molecule at least one 1,2-epoxide group of formula

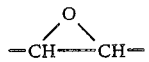

and at least one chalcone or cinnamate group of formula

wherein Ar is a benzene ring or a benzene ring substituted by alkyl, cycloalkyl, alkenyl, alkoxy, alkoxycarbonyl, each of these groups having a maximum of nine carbon atoms, halogen, hydroxy, a primary, secondary or tertiary amino, nitro, a carboxyl, sulfonic or phosphonic acid group or salt thereof;

X is a chain of the formula

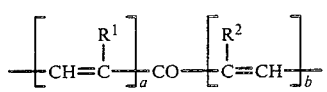

or

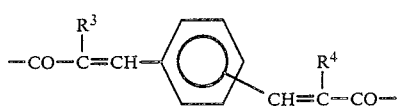

or

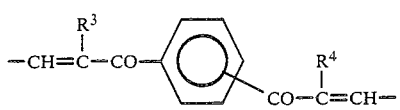

or

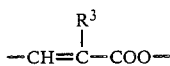

$R^1$ and $R^2$ individually denote a hydrogen atom, an alkyl group of 1 to 4 carbon atoms, or conjointly denote a polymethylene chain of 2 to 4 methylene groups, $R^3$ and $R^4$ each denote a hydrogen atom, an alkyl group of 1 to 4 carbon atoms, or a phenyl group, and a and b each denote zero, 1, or 2 with the proviso that they do not both denote zero, or with a mixture of (C) a compound containing at least one 1,2-epoxide group of formula I, together with (D) a compound containing at least one chalcone or cinnamate group of formula II, or with a mixture of a light sensitive compound (B) with a compound (C) and/or (D) as herein defined, such that the layer solidifies by thermal polymerization and becomes essentially non-tacky but remains photocrosslinkable, and subsequently, (ii) exposing the solidified layer to actinic radiation in a predetermined pattern such that exposed parts of the layer are crosslinked and
(iii) removing those parts of the layer which have not become substantially crosslinked by treatment with a solvent therefor.

2. A process according to claim 1, in which the group of formula I forms part of a 2,3-epoxypropyl group.

3. A process according to claim 2, in which the 2,3-epoxypropyl group is directly attached to an atom of oxygen, nitrogen, or sulphur.

4. A process according to claim 1, in which the group —Ar—X— is a cinnamoyloxy group or forms part of a group of formula

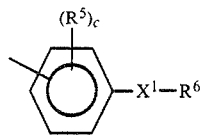

or

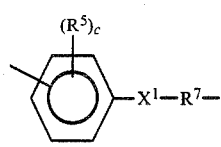

where
X¹ denotes a group of formula III, IV or V,
each $R^5$ represents a halogen atom, an alkyl, cycloalkyl, alkenyl, alkoxy, or alkoxycarbonyl group containing up to 9 carbon atoms, a hydroxy group, a primary, secondary or tertiary amino group, a nitro group, a carboxyl, sulfonic, or phosphonic acid group or a salt thereof,
each c represents zero or an integer of 1 to 4,
$R^6$ denotes an alkyl group of 1 to 6 carbon atoms, an alkenyl group of 2 to 6 carbon atoms, a cycloalkyl group of 3 to 6 carbon atoms, an aryl group of 6 to 15 carbon atoms or an alkaryl or aralkyl group of 7 to 10 carbon atoms, or each of said groups being substituted by one or more hydroxyl groups, and
$R^7$ denotes an alkylene group of 1 to 6 carbon atoms, an alkenylene group of 2 to 6 carbon atoms, a cycloalkylene group of 3 to 6 carbon atoms, an arylene group of 6 to 15 carbon atoms, or an alkarylene or aralkylene group of 7 to 10 carbon atoms.

5. A process according to claim 4, in which $R^6$ denotes a group of formula

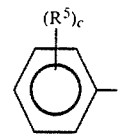

or a methyl or ethyl group, in which $R^5$ and c are as defined in claim 4.

6. A process according to claim 4 in which $R^7$ denotes a group of formula

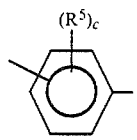

in which $R^5$ and c are as defined in claim 4.

7. A process according to claim 4, in which (B) is a glycidyl ester of a cinnamic acid, a partial ester formed by reaction of an epoxide resin with less than one equivalent of a cinnamic acid, a glycidyl ether of a monohydric or dihydric phenol containing a chalcone unit, a glycidyl ether prepared by reacting a diglycidyl ether containing a chalcone unit with a bisphenol or with a hydantoin, or a glycidyl derivative prepared by reacting a diglycidyl derivative of a bisphenol or hydantoin with a hydroxyl-substituted chalcone.

8. A process according to claim 4 in which (B) is a glycidyl ether of formula

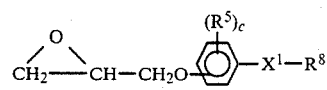

or

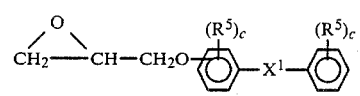

or

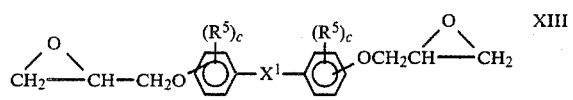

where
$R^8$ denotes a methyl or ethyl group, and
$X^1$, $R^5$ and c are as defined in claim 4.

9. A process according to claim 7 in which (B) is glycidyl cinnamate or a partial reaction product of cinnamic acid with an epoxidised novolak or a diglycidyl ether of bisphenol A.

10. A process according to claim 1 in which (B) is a compound of formula

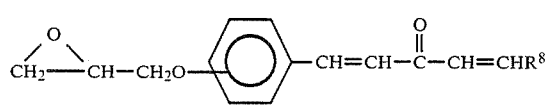

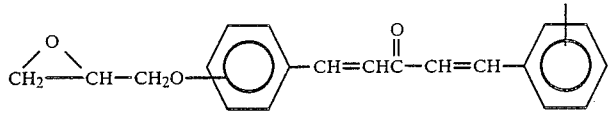

XV and

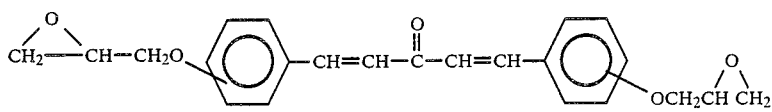

XVI where
R[8] denotes a methyl or ethyl group, and
R[9] represents a hydrogen atom or a hydroxy group.

11. A process according to claim 7 in which (B) represents a glycidyl ether prepared by reaction of a bisphenol A diglycidyl ether with 2,4-, 2',4-, 2',4'-, 2',3-, 2,5'-, 2,2'-, 4,4'-, or 3,4'-dihydroxychalcone, or 1,5-bis(p-hydroxyphenyl)penta-1,4-dien-3-one, a glycidyl derivative prepared by reacting N,N'-diglycidyl-5,5-dimethyl hydantoin with 1,5-bis(p-hydroxyphenyl)penta-1,4-dien-b 3-one, 4,4'-diglycidyloxychalcone, 1,4-bis(3-(4-glycidyloxyphenyl)-3-oxo-1-propenyl)benzene, 4,4'-diglycidyl-2,6-dimethylchalcone, 1-(p-glycidyloxyphenyl)hexa-1,4-dien-3-one, 1-(p-glycidyloxyphenyl)-5-phenylpenta-1,4-dien-3-one, 1-(p-glycidyloxyphenyl)-5-(p-hydroxyphenyl)penta-1,4-dien-3-one, or 1,5-bis(p-glycidyloxyphenyl)penta-1,4-dien-3-one.

12. A process according to claim 1, in which the compound (C) is a mono or polyglycidyl ester, a mono- or polyglycidyl ether, or a poly(N-glycidyl) compound.

13. A process according to claim 12 in which the compound (C) is 2,2,4-trimethylpentyl glycidyl ether, phenyl glycidyl ether, butyl glycidyl ether, a diglycidyl ether of 2,2-bis(4-hydroxyphenyl)propane, bis(4-hydroxyphenyl)methane or butane-1,4-diol, or 1,3-diglycidyl-5,5-dimethylhydantoin.

14. A process according to claim 1, in which compound (D) is a full or partial ester of cinnamic acid with an aliphatic glycol or a polyol, or an epoxide resin that has been fully esterified by a cinnamic acid.

15. A process according to claim 4, in which
(i) the compound (D) is of formula

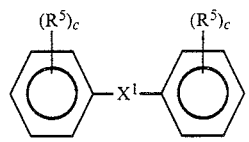

XVII or

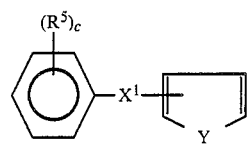

XVIII where
X[1], R[5] and c are as defined in claim 4, and
Y denotes an oxygen or sulphur atom, or
(ii) the compound (D) is an epoxide resin that has been advanced to negligible epoxide content by reaction with a chalcone of formula XVII or XVIII in which one or two groups R[5] are hydroxy, carboxyl, or primary and secondary amino groups.

16. A process according to claim 1, in which (A) has a significant heat-polymerising effect on (B) and (C) only at temperatures above 100° C.

17. A process according to claim 16, in which (A) is a complex of boron trichloride or of boron trifluoride, a chelate of boron difluoride, dicyandiamide, or an imidazole.

18. A process according to claim 17, in which (A) is a complex of boron trichloride with a tertiary amine or of boron trifluoride with a triaryl phosphine, with piperidine or with a primary amine.

19. A process according to claim 1, in which the said layer is heated at a temperature of 120° to 200° C. for from 2 to 20 minutes.

* * * * *